United States Patent [19]
Ichinose et al.

[11] Patent Number: 5,759,291
[45] Date of Patent: Jun. 2, 1998

[54] PHOTOVOLTAIC CELL AND METHOD OF MAKING THE SAME

[75] Inventors: Hirofumi Ichinose, Tokyo; Akio Hasebe, Nagahama; Tsutomu Murakami, Nara; Satoshi Shinkura, Tsuzuki-gun; Yukie Ueno, Nara, all of Japan

[73] Assignee: Canon Kabushiki Kaisha, Tokyo, Japan

[21] Appl. No.: 671,329

[22] Filed: Jun. 27, 1996

[30] Foreign Application Priority Data

Jun. 28, 1995 [JP] Japan ................. 7-162714

[51] Int. Cl.$^6$ ............. H01L 31/04; H01L 31/18; H01L 31/0224
[52] U.S. Cl. ............. 136/256; 257/459; 438/98
[58] Field of Search ............ 136/256; 257/459; 437/2–5, 180–181; 438/98

[56] References Cited

U.S. PATENT DOCUMENTS

| | | | |
|---|---|---|---|
| 3,489,615 | 1/1970 | Mann et al. | 136/256 |
| 4,260,429 | 4/1981 | Moyer | 136/256 |
| 4,283,591 | 8/1981 | Böer | 136/256 |
| 4,348,546 | 9/1982 | Little | 136/256 |
| 4,542,258 | 9/1985 | Francis et al. | 136/256 |
| 5,084,107 | 1/1992 | Deguchi et al. | 136/256 |
| 5,232,519 | 8/1993 | Glatfelter et al. | 136/256 |
| 5,457,057 | 10/1995 | Nath et al. | 437/2 |

*Primary Examiner*—Aaron Weisstuch
*Attorney, Agent, or Firm*—Fitzpatrick, Cella Harper & Scinto

[57] ABSTRACT

A photovoltaic device comprising a semiconductor layer, a current collecting electrode on said semiconductor layer, and a bus bar electrically connected to the current collecting electrode. The current collecting electrode comprises a metal wire. A part of the current collecting electrode is positioned between the bus bar and the semiconductor layer.

65 Claims, 10 Drawing Sheets

100

100

200

200

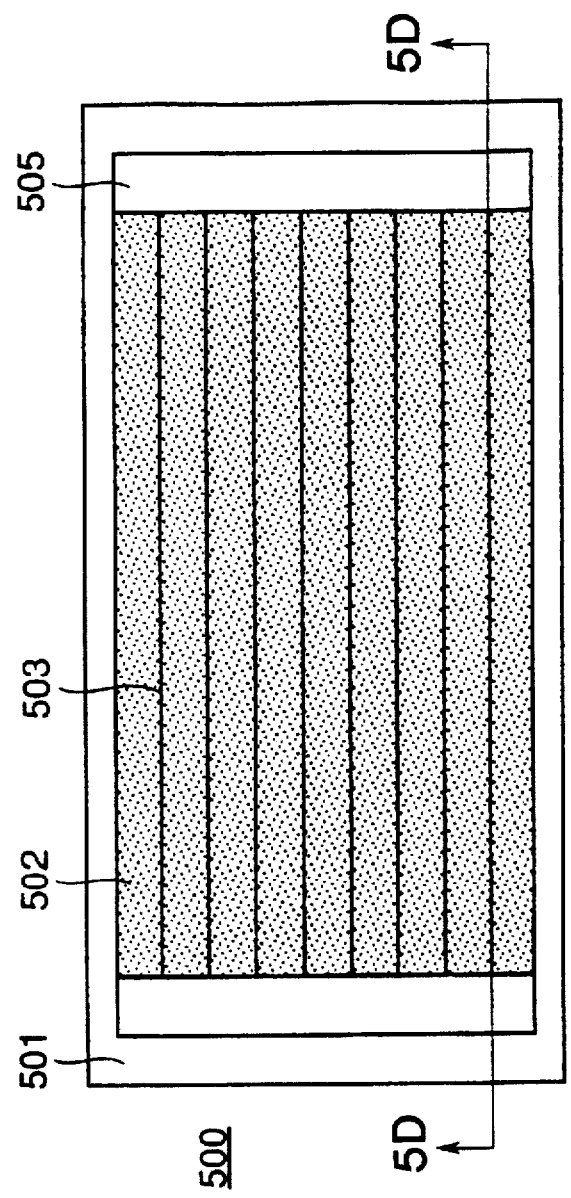
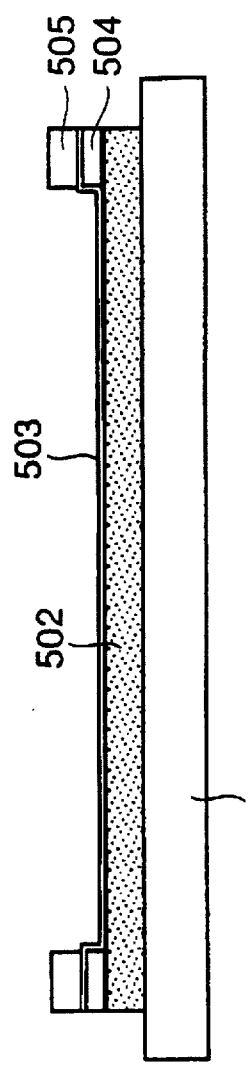

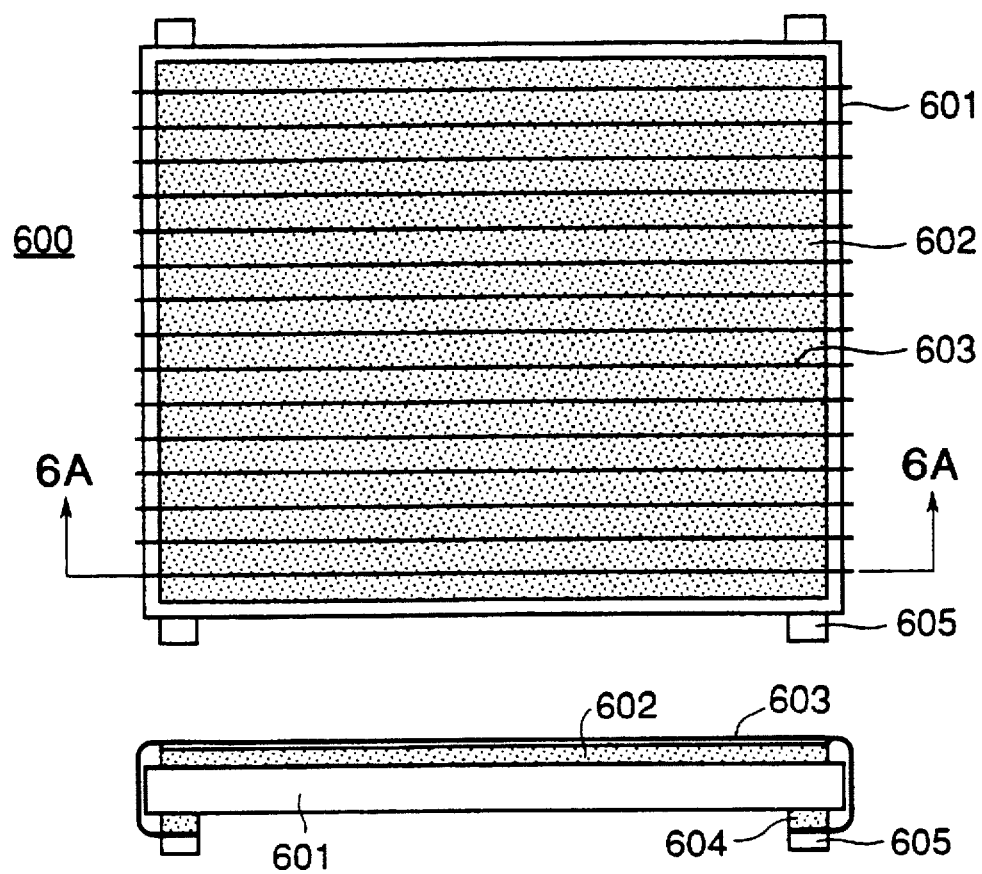

FIG.7A
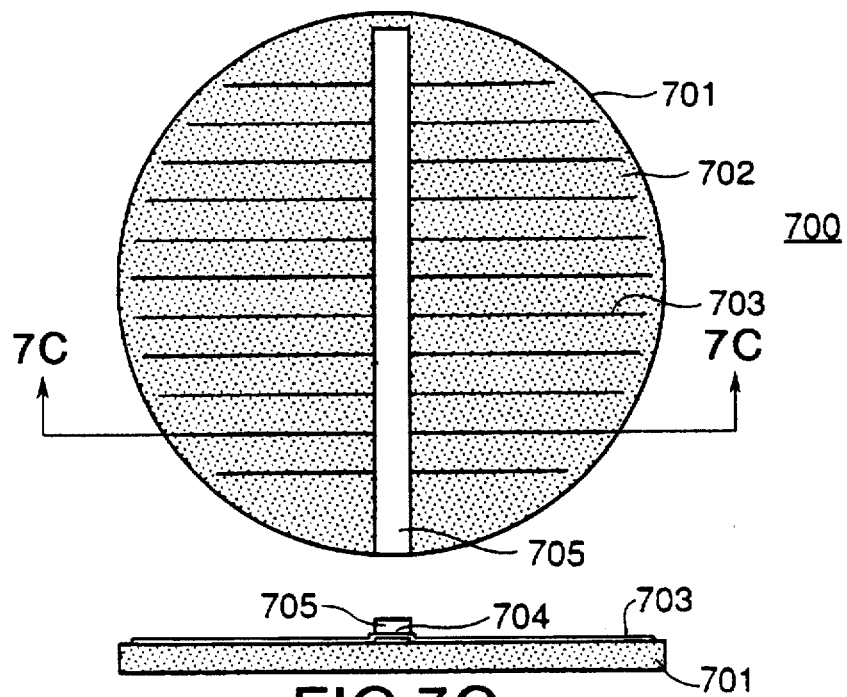
FIG.7C
FIG.7B
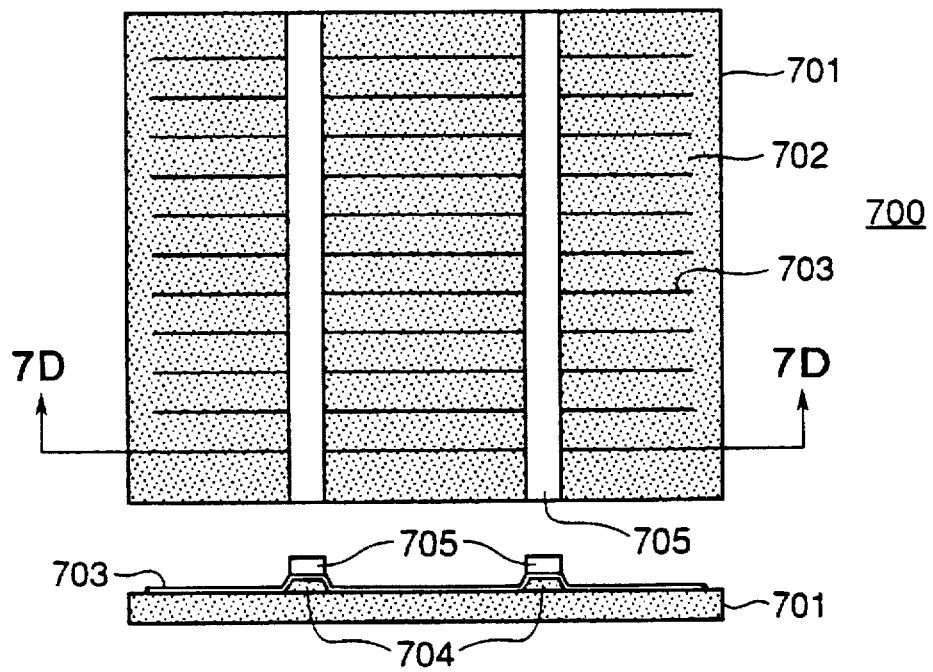
FIG.7D

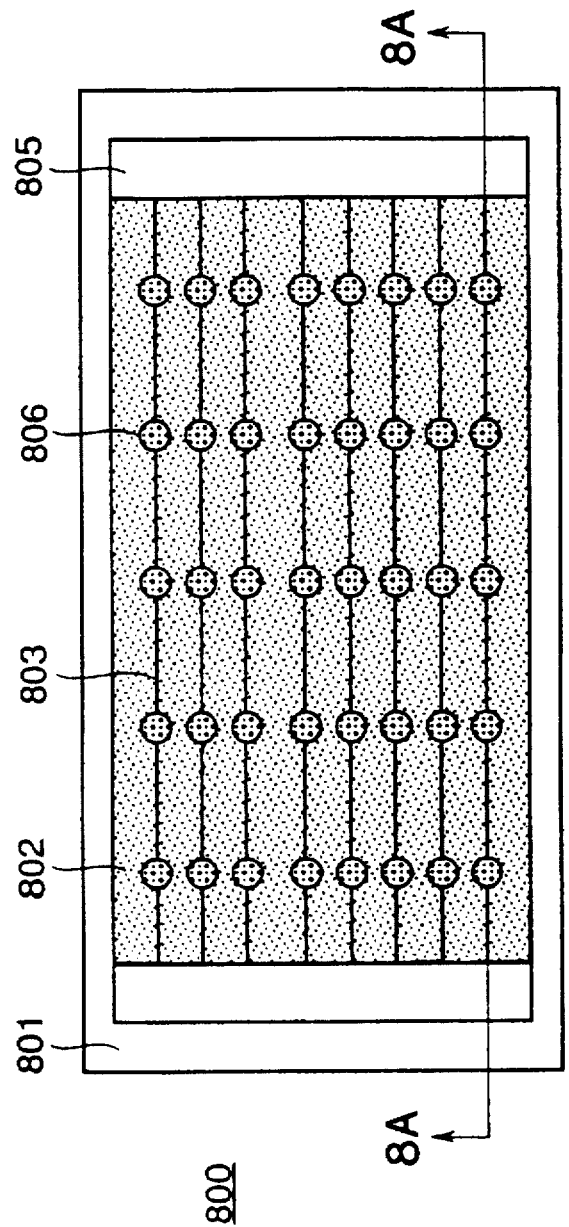
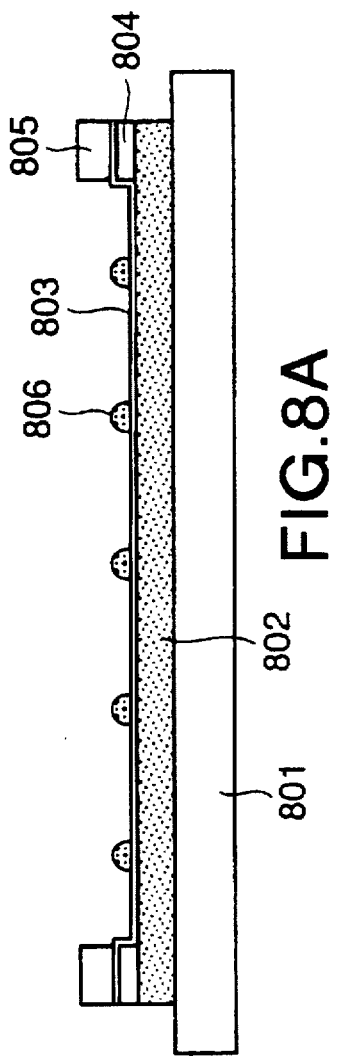
FIG.8
FIG.8A

PHOTOVOLTAIC CELL AND METHOD OF MAKING THE SAME

BACKGROUND OF THE INVENTION

1. Field of the Invention

The present invention relates to a photovoltaic cell with improved electrode structure and method of making the same.

2. Related Background Art

Solar cells are generally provided with a current collecting electrode, composed of a finely structured metallic member, on the light-receiving surface. Such current collecting electrode, being provided on the light-receiving side of the solar cell, constitutes a so-called shadow loss area and decreases the effective area of power generation of the solar cell. For this reason, the current collecting electrode is formed in the shape of a relatively thin-membered comb. Since such current collecting electrode is usually thin and oblong, there are required a material and a cross-sectional design that reduce the electrical resistance.

U.S. Pat. No. 5,084,107 proposes the use of a metal wire for such current collecting electrode. Also, a method of forming such current collecting electrode is disclosed in U.S. Pat. No. 4,348,546. Also, a process for forming a relatively thick metal electrode, called a bus bar, for collecting the currents collected by a plurality of such current collecting electrodes is disclosed for example in U.S. Pat. Nos. 4,260,429 and 4,283,591.

FIG. 9 shows an example of a solar cell module, having the conventional electrode configuration explained above, wherein there are shown the main body 900 of the solar cell; substrate 901; a semiconductor layer 902; current collecting electrodes 903; solder or conductive paste beads 904; bus bars 905; and bonding agent beads 906. The bus bars serve, as a part of the electrode structure, to collect the currents in the current collecting electrodes at an end of the solar cell.

In such conventional configuration of the current collecting electrodes, the metal wire constituting the current collecting electrodes and the bus bars are electrically connected by the following method:

i) At first, in positioning the metal wire, it is temporarily fixed, for example with a bonding agent, outside the active area of the solar cell; and ii) The portion of the metal wire, present on the bus bar, is electrically and mechanically fixed thereto with conductive paste such as silver paste, or solder.

In the case of using the conductive paste, it is dispensed at plural points by an applicator and is then dried or hardened. In the case of solder, the metal wire and bus bar are directly fixed with solder.

However, such conventional electrode configuration as explained above, if applied to a solar cell, results in the following drawbacks:

1) In the method of connecting the metal wire to the bus bar with silver paste, there are required not only the applicator for dispensing a suitable amount of the silver paste but also the steps of heating, drying, and hardening the silver paste, so that the production throughput is low ;

2) As the silver paste is applied onto the protruding electrode, it may pierce through a sealing lamination;

3) The connection with solder to the bus bar is difficult to make through coating with the above-mentioned conductive adhesive, so that soldering has to be performed after partial removal of the adhesive layer. As a result, connections have to be made at plural points, with undesirably low work efficiency;

4) For fusing the solder, there has to be locally applied high heat of 250° C. to 350° C.;

5) If solder flux is used or solder with rosin is used for improving the solder flow, such flux or rosin has to be removed in a separate step such as ultrasonic washing;

6) The amorphous semiconductor solar cells or the like are easily damaged with negative influences on various characteristics, by the high temperature and washing steps described in the foregoing items 1) to 5); and 7) In any of the foregoing methods, in order to position the metal wire, it has to be temporarily fixed with bonding agent outside the active area of the solar cell. Consequently, such temporary fixing requires an additional area in addition to the area required for forming the bus bar, thus leading to an increase of the required area.

SUMMARY OF THE INVENTION

The object of the present invention is to provide a photovoltaic cell comprising a semiconductor layer, a current collecting electrode, and a bus bar electrically connected with the current collecting electrode, wherein the current collecting electrode comprises a metal wire, and a part of the current collecting electrode is provided between the bus bar and the semiconductor layer.

Such configuration provides an electrode structure of the photovoltaic cell which can be made by a simple manufacturing process with a high throughput. As a result, there can be obtained a photovoltaic cell with satisfactory characteristics, namely with satisfactory conversion efficiency and shunt resistance, because of the following reason. The adhesion of the current collecting electrode with the semiconductor layer or the transparent electrode layer is achieved by heating and pressing, due to the conductive paste present around the current collecting electrode. Besides, the present invention enables simultaneous connection of the current collecting electrode with the bus bar, thereby allowing a reduction in the number of steps and to lower the manufacturing cost. Furthermore, as the current collecting electrode and the bus bar can be securely connected, there can be obtained a photovoltaic cell with a low connection resistance and with a high output, and there can also be obtained a solar cell module that is highly reliable in outdoor use, such as in use as a roofing material.

The above-mentioned conductive paste may also be applied on the bus bar.

Also, prior to the heating and pressing mentioned above, the current collecting electrode is preferably fixed in advance, by a bonding material or an adhesive material, on the semiconductor layer, or on the transparent conductive layer formed on the semiconductor layer, or on a part of the substrate on which the semiconductor layer is formed. Such fixation is temporary until the current collecting electrode is connected with the bus bar and the semiconductor layer by heating and pressing, thereby dispensing with the external supporting means and significantly improving the productivity.

Furthermore, by providing the bonding agent or adhesive material with electroconductivity, there can be simultaneously achieved mechanical connection and electrical connection between the current collecting electrode and/or the bus bar, and the photovoltaic element, whereby a photovoltaic device of improved characteristics is obtained.

BRIEF DESCRIPTION OF THE DRAWINGS

FIGS. 5A to 5F are schematic views of a solar cell having the bus bar of the present invention on the top surface of the solar cell substrate;

FIGS. 6 and 6A are schematic views of a solar cell having the bus bar of the present invention on the rear surface of the solar cell substrate;

FIGS. 7A and 7D are schematic views of a solar cell having the bus bar of the present invention in the active area;

FIGS. 8 and 8A are schematic views of a solar cell in which the current collecting electrode of the present invention is fixed by partial application of conductive bonding agent.

DESCRIPTION OF THE PREFERRED EMBODIMENTS

Metal wire

Figure 1A:
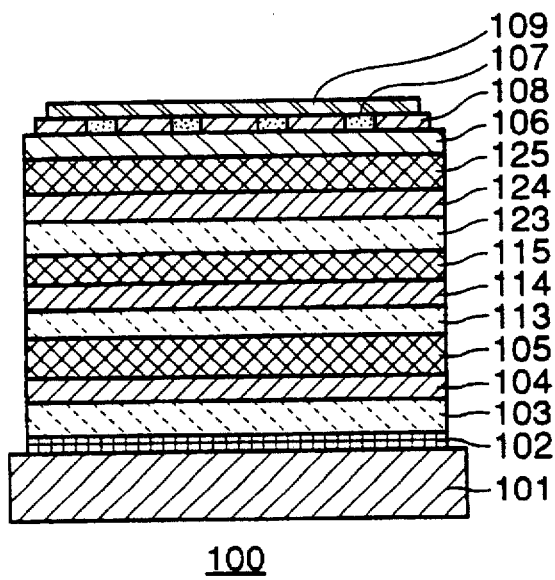
FIGS. 1A and 1B are schematic cross-sectional views of an amorphous solar cell, employing the electrode configuration of the present invention.

The metal wire employed in the present invention can be advantageously composed of a material having a low electrical resistance and supplied industrially in the form of a wire, such as copper, silver, gold, platinum, aluminum, molybdenum, tungsten, or an alloy thereof. If desirable, such metal wire may be surfacially provided with a thin metal layer, for the purpose of prevention of corrosion or oxidation, for improvement in the adhesion with conductive resinous material, or for improvement in electrical conductivity. In particular, the above-mentioned surface metal layer is employed in order to avoid a high resistance resulting from surface oxidation in case the metal wire is composed of copper or to avoid a high contact resistance in case conductive particles of the above-mentioned covering layer are composed of graphite or a metal oxide.

The above-mentioned surfacial metal layer is composed of a noncorrodable precious metal such as silver, palladium, silver-palladium alloy or gold, or a noncorrodable metal such as nickel or tin. The above-mentioned surfacial metal layer is advantageously formed by a plating method or a cladding method. Also, the wire may be coated with a conductive resin, prepared by dispersing the above-mentioned metal as a filler in a resinous material. The coating thickness is determined as desired, but, in case of a metal wire with a circular cross section, it is preferably within a range from 1 to 10% of the diameter of the metal wire.

The cross-sectional shape of the metal wire is preferably circular, but it can also be rectangular and it can be selected as desired. The diameter of the metal wire is determined in consideration of the balance between the loss by electrical resistance and the shadow loss. More specifically, there is advantageously employed a copper wire with a diameter of 25 μm to 1 mm. More preferably, it is selected within a range from 25 to 200 μm to obtain a highly efficient solar cell. A wire thinner than 25 μm is easily breakable and is difficult to manufacture, and also shows a larger electrical resistance loss. Also, a diameter exceeding 200 μm results in a larger shadow loss, or increases the irregularity of the surface of the solar cell, requiring a thicker filling material such as EVA, during sealing for example by lamination.

Such metal wire can be formed with a desired diameter with a known wire extending machine. The wire obtained via such wire extending machine is hard, but it may be made softer by the known annealing method, according to the desired ductility or bendability.

Conductive Paste

The conductive paste in the present invention is employed for adhering the metal wire to the surface of the solar cell and to the bus bar. The adhesion is made by coating the entire metal wire or a part thereof with the conductive adhesive and effecting heating and/or pressing. In the adhesion of the current collecting electrode to the bus bar, the adhesion may also be made by coating the bus bar with the conductive adhesive in advance and effecting heating and/or pressing.

In the present invention, the conductive paste for adhering the metal wire is obtained by dispersing conductive particles in a polymer resin. The polymer resin is preferably capable of easily forming a film on the metal wire, and being excellent in working efficiency, flexibility, and weather resistance. Preferred examples of thermosetting resin satisfying such requirements include epoxy resin, urethane resin, phenolic resin, polyvinylformal resin, alkyd resin and denatured resins thereof. Particularly, urethane resin is employed as an insulating coating material for enamel wire and is excellent in flexibility and productivity. Also, preferred examples of thermoplastic resin satisfying such requirements include phenoxy resin, polyamidimide resin, polyamide resin, butyral resin, melamine resin, fluorinated resin, acrylic resin, styrene resin, and polyester resin.

The conductive particles mentioned above are a pigment for providing the electroconductivity, and can be composed, for example, of graphite, carbon black, or a semiconductive oxide material such as $In_2O_3$, $TiO_2$, $SnO_2$, ITO, ZnO or such material containing a suitable dopant. The diameter of such conductive particles has to be smaller than the thickness of the coating layer to be formed, but if it is excessively small, a desired conductivity or resistivity cannot be obtained because of the contact resistance of the particles. Because of these reasons, the average diameter of the conductive particles is preferably within a range from 0.02 to 15 μm.

The conductive particles and the polymer resin are mixed in a suitable ratio for obtaining a desired resistivity, and an increase in the amount of the conductive particles deteriorates the stability of the coating film because of the lowered proportion of the resin, though the resistivity becomes lower. On the other hand, an increase in the amount of the resin increases the resistance, because of the reduced contact of the conductive particles. Consequently, the preferred ratio is suitably selected according to the polymer resin and the conductive particles to be employed, and the desired physical properties. More specifically, a satisfactory resistivity can be obtained when the conductive particles occupy 5 to 95 vol.%.

The specific resistivity of the conductive resin has to be negligibly small for collecting the current generated by the solar cell and to be adequate for avoiding shunts, and is preferably within a range from 0.01 to 100 Ωcm, since a resistivity lower than 0.01 Ωcm reduces the barrier function for avoiding the shunt, while that exceeding 100 Ωcm increases the loss by the electrical resistance. The mixing of the conductive particles and the polymer resin can be made with an ordinary dispersing apparatus such as a 3-roll mill, a paint shaker, or a bead mill. A known dispersing agent may be added, if desired, for achieving satisfactory dispersion. Also, dilution with suitable solvent may be executed at or after the dispersion, in order to adjust the viscosity of the conductive resin.

Bus Bar

The bus bar of the present invention is provided either on the light-receiving side or on the opposite side of the photovoltaic device. It may be provided within the active area on the light-receiving side, but is preferably provided outside the active area for attaining a higher efficiency.

The bus bar of the present invention is advantageously composed of a material which has a low electrical resistance and is supplied industrially as a strip material, such as copper, silver, gold, platinum, aluminum, tin, lead, or nickel. It may also be composed of an alloy of such metals. In particular, copper is advantageously employed because it has a low electrical resistance, is inexpensive, and allows the selection of hard or soft copper as desired.

If desired, such bus bar may be surfacially provided with a thin metal layer, for the purpose of prevention of corrosion or oxidation, or improvement in the adhesion with the conductive resin or in electrical conductivity.

Such surfacial metal layer can be composed of a noncorrodable precious metal such as silver, palladium, silver-palladium alloy or gold, or a noncorrodable metal such as nickel or tin. Silver and gold are particularly advantageously employed because of stability against moisture and satisfactory adhesion to the conductive resin. The above-mentioned surfacial metal layer is advantageously formed by a plating method or a cladding method.

Also, there may be employed a method of coating conductive paste at least on a part of the bus bar, thereby electrically connecting the bus bar with the metal wire.

Bonding or Adhesive Agent

The bonding or adhesive agent in the present invention is used for bonding the metal wire to a part of the solar cell, for fixing the metal wire, and positioning thereof between the bus bars. The bonding or adhesive agent can therefore serve for fixing the metal wire to the photovoltaic device and for fixation between the bus bar and the photovoltaic device. The bonding or adhesive agent may be applied on the photovoltaic device, or on the bus bar if the material is conductive.

Examples of such bonding agent include acrylic, rubber, silicone, polyvinylether, epoxy, polyurethane, nylon, polyamide, inorganic, and composite bonding agents.

Also, there may be employed a conductive bonding agent such as the conductive paste mentioned above. Among such bonding agents, there is advantageously employed an agent excellent in bonding ability, tack, supporting ability, electrical insulation, and moisture resistance. In particular, acrylic and silicone bonding agents are advantageously employed because of excellent durability, heat resistance, and supporting ability. The bonding agent may be applied uniformly, for example, with an applicator. There may be added steps for drying, heating, pressing, and light irradiation according to the kind of bonding agent.

Also, the adhesive material may be used in the form of an adhesive tape, an adhesive sheet, or a double-sided adhesive tape, in which a substrate and an adhesive material are superposed. Such adhesive material may be provided with electroconductivity.

Such adhesive material can improve the productivity, by dispensing with the drying time required for the bonding agent and also the means for externally supporting the current collecting electrode may be dispensed with. Also, the complex device for applying a suitable amount of the bonding agent can be dispensed with. Furthermore, the adhesive material and the bonding agent may be used in combination.

Substrate, First Electrode, and Semiconductor Layer

The photovoltaic device of the present invention preferably comprises a substrate, a first electrode provided thereon, a semiconductor layer provided on the first electrode and contributing to the current generation, and a second electrode consisting of the current collecting electrode and the bus bar of the present invention, provided on the light-incident side of the semiconductor layer. If desired, a transparent conductive layer is provided between the light entering face of the semiconductor layer and the current collecting electrode, for preventing reflection and reducing the surface resistance.

The first electrode is formed by depositing a metal, for example by screen printing or evaporation. The kind of the metal is suitably selected, so as to obtain a suitable semiconductive or ohmic property.

In case the semiconductor layer is composed of a thin film, such as amorphous silicon, a supporting substrate is required, which can be an insulating or conductive substrate. The above-mentioned first electrode is formed on such substrate. On the other hand, if the semiconductor layer is in a bulk form, the supporting substrate can be dispensed with.

The first electrode may be composed of a metal substrate, such as of stainless steel or aluminum. It may also be composed of a layer of an evaporated metal, such as chromium, aluminum, or silver, formed on an insulating substrate such as of glass, polymer resin, or ceramics. Also, in case of a crystalline silicon solar cell, it may also be formed by screen printing of silver paste, without the substrate.

The semiconductor layer is required to have a semiconductor junction such as a pn junction, a pin junction or a Schottky junction, and can be advantageously composed of a Group IV semiconductor such as crystalline silicon, polycrystalline silicon, thin film polycrystalline silicon, or amorphous silicon, or a Groups II–VI semiconductor such as CdS or CdTe, or a Groups III–V semiconductor such as GaAs. In addition to the single cell, there can be advantageously utilized a tandem cell or a triple cell in which a plurality of pin or pn junctions are superposed.

An example of such tandem cell configuration is constructed by superposing top and bottom layers each of a pin structure having an a-Si i layer, or superposing a top layer of a pin structure having an a-Si i layer and a bottom layer of a pin structure having an a-SiGe i layer. Also, there may be employed a configuration consisting of a top layer of a pin structure having an a-Si i layer and a bottom layer having a polycrystalline thin film junction.

Also, an example of a triple cell configuration is constructed by a top layer and a middle layer of a pin structure each having an a-Si i layer and a bottom layer of a pin structure having an a-SiGe i layer, or by a top layer of a pin structure having an a-Si i layer, a middle layer of a pin structure having an a-SiGe i layer, and a bottom layer of a pin structure having an a-SiGe i layer.

The above-mentioned transparent conductive layer is advantageously composed of a known material such as ITO, $SnO_2$, or $In_2O_3$.

The second electrode, consisting of the current collecting electrode and the bus bar of the present invention, is provided on the light incident side of the semiconductor layer mentioned above. In such case, the current collecting electrodes are preferably positioned in parallel manner with a suitable pitch, in consideration of the trade-off between the loss in the current collection by the electric resistance and the shadow loss. As an example, if the transparent electrode layer has a sheet resistance of about 100 $\Omega/\square$, the current collecting electrodes are preferably spaced by about 5 mm. A maximum efficiency can be obtained by optimization to decrease or increase the pitch if the wire diameter is smaller or larger.

Figure 1B:
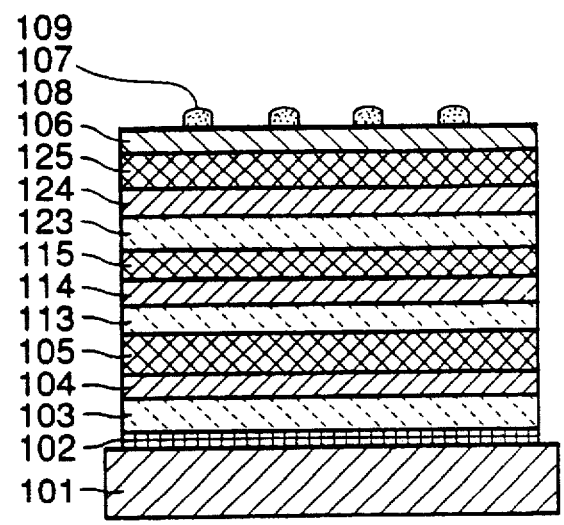

FIGS. 1A and 1B are schematic cross-sectional views showing an example of the electrode configuration of the present invention applied to a triple-junction amorphous solar cell, wherein there are shown a main body 100 of the solar cell; a substrate 101; a first electrode 102; n type semiconductor layers 103, 113, 123; i type semiconductor layers 104, 114, 124; p type semiconductor layers 105, 115, 125; a transparent conductive film 106; a current collecting electrode 107; bonding agent 108; and a bus bar 109. FIG. 1A is a cross-sectional view of the state with the formation of the bus bar, and FIG. 1B is a cross-sectional view of the state when the current collecting electrodes are formed on the cell surface. Though FIGS. 1A and 1B illustrate triple-junction structures, the current collecting electrode of the present invention is naturally applicable also to structure, having one or two semiconductor junctions.

Figure 2A:
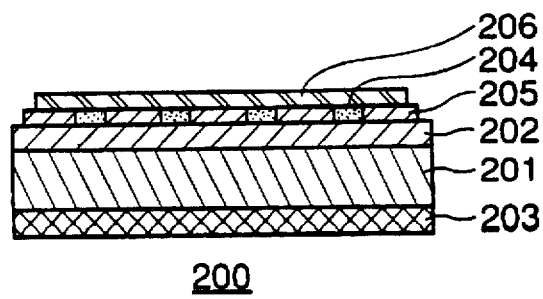
FIGS. 2A and 2B are schematic cross-sectional views of a crystalline solar cell, employing the electrode configuration of the present invention.
Figure 2B:
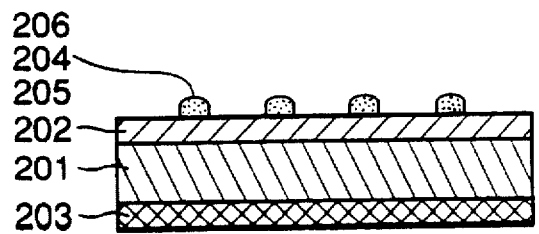

FIGS. 2A and 2B are schematic cross-sectional views showing an example of the electrode configuration of the present invention applied to a crystalline solar cell, wherein there are shown a main body 200 of the solar cell; a semiconductor layer 201 consisting of a silicon wafer; a semiconductor layer 202 constituting a junction with the semiconductor layer 201; a rear electrode 203; a current collecting electrode 204; bonding agent 205; and a bus bar 206. FIG. 2A is a cross-sectional view of the state with the formation of the bus bar, and FIG. 2B is a cross-sectional view of the state of the formation of the current collecting electrodes on the cell surface.

The electrode configuration of the present invention is particularly suitable for forming a solar cell of a large area. For example, in the case of preparing a solar cell of a square shape with a length of 30 cm, electrodes of a length of 30 cm can be arranged on the semiconductor layer with a pitch of 30 cm to constitute the current collecting electrode of the present invention, and there is formed a bus bar accommodating a relatively large current, in order to guide the currents from the above-mentioned current collecting electrodes to an output terminal.

Manufacturing Method

The current collecting electrode is adhered to the surface of the photovoltaic device by bonding, with heat and/or pressure, the current collecting electrode, covered with the conductive paste, onto the semiconductor layer or the transparent conductive film at the light-receiving side. The heating temperature is preferably at least equal to the temperature at which the conductive paste, constituting the covering layer, softens and adheres to the solar cell surface. Also, the pressure is preferably such as to cause a suitable deformation of the covering layer but lower than a pressure causing destruction of the solar cell. More specifically, in the case of a thin solar cell composed for example of amorphous silicon, a pressure from 0.1 to 1.0 $kg/cm^2$ is preferred.

In addition to the foregoing, the formation of the current collecting electrode on the surface of the photovoltaic device may also be achieved by forming the conductive paste on the surface of the device in linear patterns or dots of a desired form, for example by screen printing, and arranging and bonding the wires thereon.

If the covering layer is thermoplastic, softening can be achieved by heating. If the covering layer is composed of a thermosetting resin, it is not subjected to the setting reaction but only to the evaporation of solvent during application onto the wire or printing onto the solar cell substrate, and it is softened and then hardened by heating during the bonding operation.

Figure 3A:
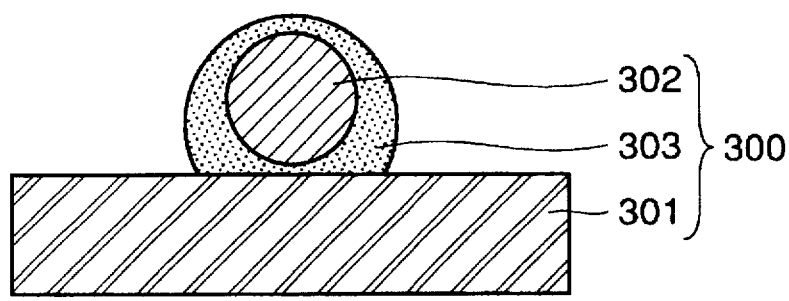
FIGS. 3A and 3B are schematic cross-sectional views showing the electrode structure on the surface of the solar cell of the present invention.
Figure 3B:
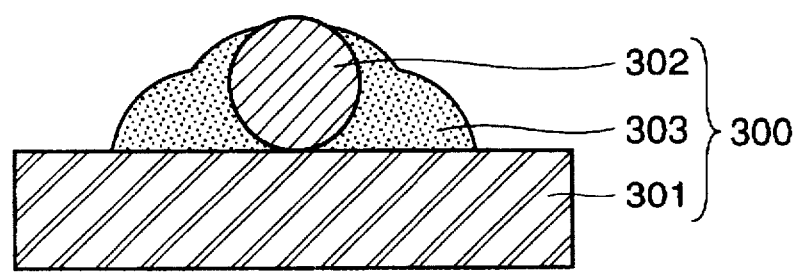

FIGS. 3A and 3B are cross-sectional views showing the bonded state of the metal wire on the solar cell surface, wherein there are shown a semiconductor layer 301; a metal wire 302; and conductive bonding agent 303. FIG. 3A is a cross-sectional view showing a state in which the metal wire is covered with the conductive bonding agent and then bonded to the surface of the semiconductor layer, and FIG. 3B is a cross-sectional view showing a state in which the conductive bonding agent is locally provided on the semiconductor layer 301, and then the metal wire is positioned thereon and bonded thereto.

Then, for electrical connection of the metal wire and the bus bar, heating and/or pressing onto the bus bar is applied in a similar manner as in the bonding of the metal wire and the solar cell.

Figure 4A:
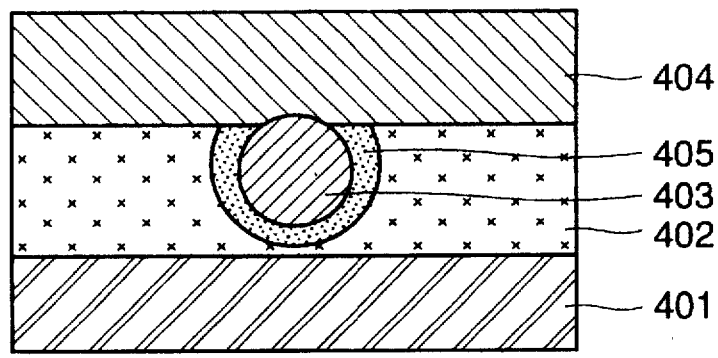
FIGS. 4A and 4B are schematic cross-sectional views showing a connecting part between the bus bar and the current collecting electrode according to the present invention.
Figure 4B:
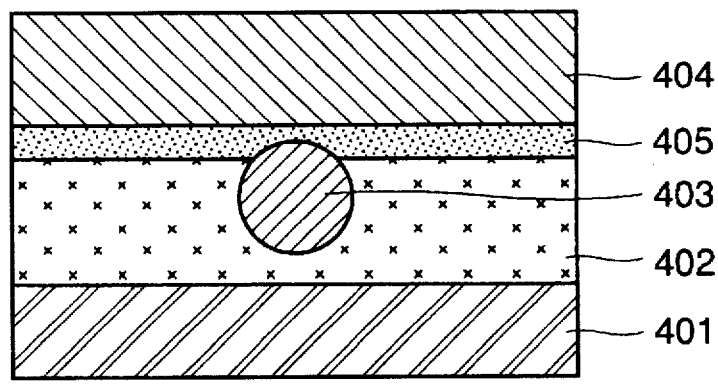

FIGS. 4A and 4B are cross-sectional views showing the state of bonding to the bus bar, wherein there are shown a semiconductor layer 401; a bonding agent or an adhesive material 402; a metal wire 403; a bus bar 404;

and conductive paste 405. FIG. 4A shows a state in which the metal wire is covered with the conductive bonding agent and then adhered to the bus bar, and FIG. 4B shows a state in which the conductive bonding agent is coated on the bus bar and the metal wire is then bonded thereto. In such case the conductive bonding agent may be coated on the entire bus bar, or in parts thereof.

The present invention is naturally applicable advantageously also to solar cells and photovoltaic devices other than an amorphous silicon solar cell, such as a crystalline solar cell, a polycrystalline solar cell, or a thin film solar cell.

FIGS. 5A to 8 show examples of the solar cell employing the electrode configuration of the present invention.

Figure 5B:
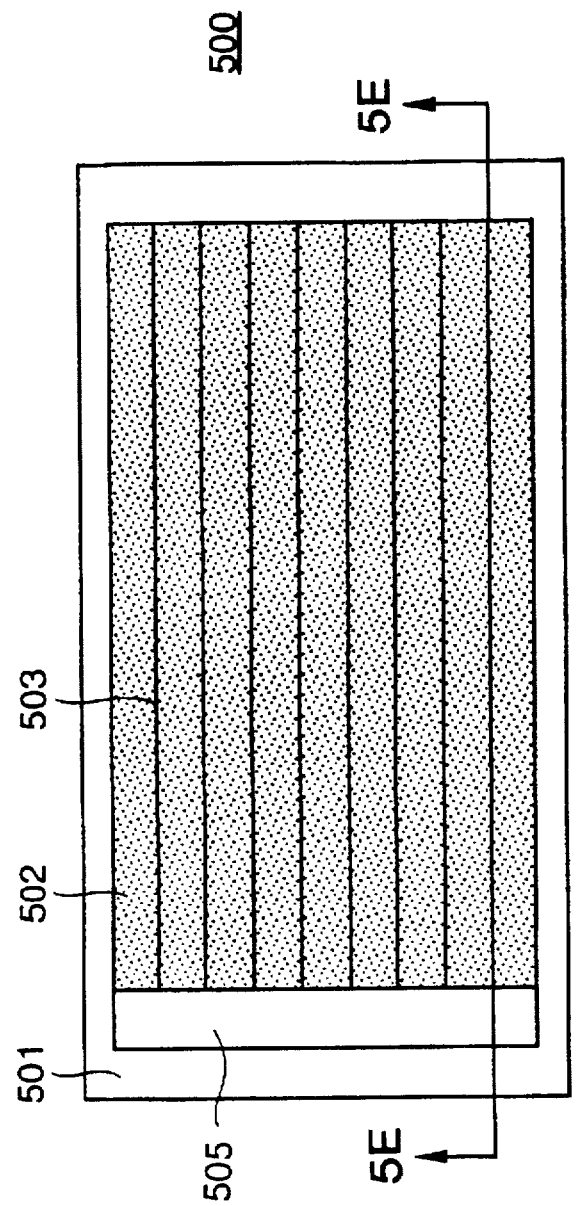
Figure 5E:
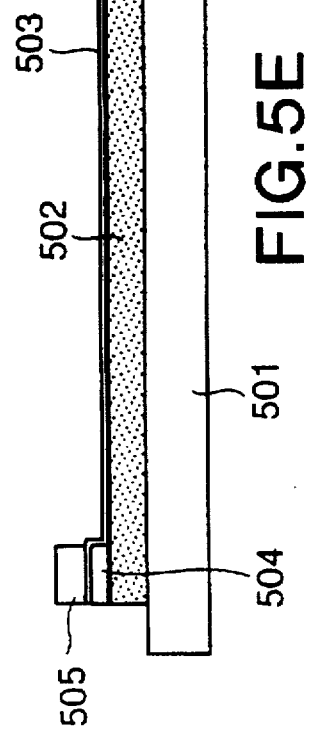
Figure 5C:
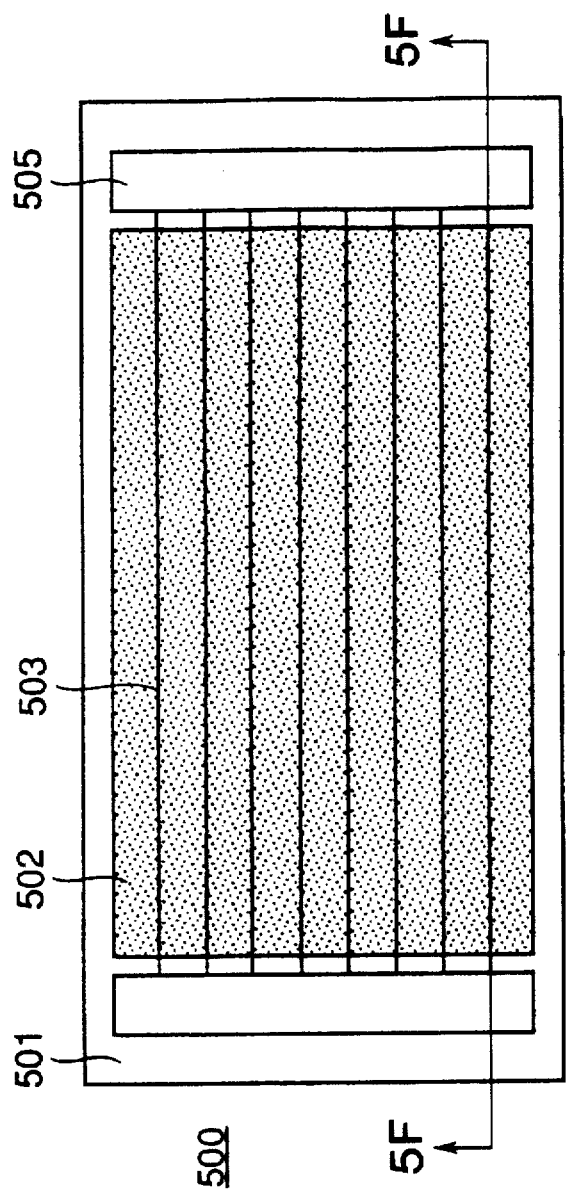
Figure 5F:
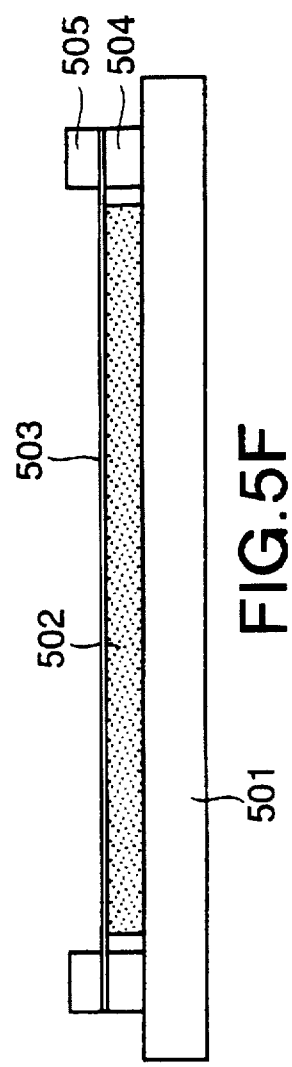

In FIGS. 5A to 5C, there are shown a main body 500 of the solar cell; a substrate 501; a semiconductor layer 502; current collecting electrodes 503; bonding agent or adhesive material 504; and bus bar(s) 505.

FIG. 5A shows a structure having bus bars 505 on both ends, capable of improving the current collecting efficiency from the metal wires 503 and suitable for a large area cell. The structure shown in FIG. 5B has a bus bar 505 at one end, thus being capable of effective utilization of the solar cell substrate and usable when a plurality of small area cells are connected in series or in parallel. In the structure shown in FIG. 5C, the current collecting electrodes 503 are fixed on the substrate 501, instead of the semiconductor layer 502, by means of the bonding agent or adhesive material 504.

FIG. 6 schematically illustrates a solar cell having the bus bar on the rear surface of the solar cell substrate, wherein there are shown a main body 600 of the solar cell; a substrate 601; the top surface of a semiconductor layer 602; current collecting electrodes 603; a bonding agent or adhesive material 604; and a bus bar 605. The active area of the solar cell can be effectively utilized because of the absence of the bus bar on the top surface of the solar cell.

FIGS. 7A and 7B schematically illustrate a solar cell having the bus bar in the active area, wherein there are shown a main body 700 of the solar cell; a supporting substrate 701; the top surface 702 of the solar cell; current collecting electrodes 703; bonding agent of adhesive material 704; and a bus bar 705. FIG. 7A shows an arrangement having a bus bar 705 at the center of the active area of a circular substrate, while FIG. 7B shows an arrangement having two bus bars within the active area of a rectangular substrate, for improving the current collecting ability from the metal wires 703.

FIG. 8 schematically illustrates a solar cell, in which the current collecting electrodes 803 are fixed by partial application of the conductive bonding agent, wherein there are shown a main body 800 of the solar cell; a substrate 801; a top surface 802 of a semiconductor layer; current collecting electrodes 803; bonding agent or adhesive material 804; bus bars 805; and conductive paste beads 806.

The solar cell, prepared as explained in the foregoing, is formed into a module by a known encapsulating method, for improving the weather resistance and the mechanical strength for outdoor use. For the bonding layer for encapsulation, there is advantageously employed EVA (ethylene vinylacetate) in consideration of its adhesion to the solar cell, weather resistance, and cushioning effect. A surface protective layer such as of glass is formed thereon, for improving moisture resistance and scratch resistance. Otherwise, a fluorinated resin film may be advantageously used for reducing the weight of the module and attaining flexibility thereof.

Examples of such fluorinated resin include ETFE (4-fluoroethylene copolymer; Tefzel supplied by DuPont) and polyfluorinated vinyl resin (Tedlar supplied by DuPont). An ultraviolet absorbing agent may be added to such resin in order to improve the weather resistance. The encapsulation can be achieved, for example, by heating and pressing under vacuum, in a commercially available apparatus such as a vacuum laminator.

EXAMPLE 1

In this example, a solar cell module, consisting of a solar cell constructed as shown in FIGS. 1A and 1B and having the electrode configuration shown in FIGS. 5A and 5B was prepared in the following manner.

The current collecting electrodes 503 were composed of covered wires as shown in FIGS. 3A and 3B. The metal wires 302 were composed of a silver-clad copper wire of a diameter of 100 μm, having a 2 μm thick clad silver layer on a copper wire core.

In the following there will be explained the method of preparing carbon paste as the conductive paste 303 for the covering layer:

(1) A mixed solvent consisting of 2.5 g of ethyl acetate and 2.5 g of IPA was placed in a shaker bottle. 22.0 g of urethane resin, constituting the main component, was then added to the solvent in the shaking bottle and agitated in a ball mill. 1.1 g of blocked isocyanate as a setting agent and 10 g of dispersing glass beads were added to the obtained solution. 2.5 g of carbon black, having a primary average particle size of 0.05 μm, was then added, as the conductive particles, to the above-mentioned solution.

(2) The shaker bottle, containing the above-mentioned materials, was subjected to dispersion for 10 hours in a paint shaker, manufactured by Toyo Seiki Mfg. Co., Ltd. Then the dispersing glass beads were removed from the completed conductive bonding agent. The average particle size of the conductive bonding agent was measured as about 1 μm. A similar result was also obtained with a bead mill, instead of the paint shaker.

(3) The above-mentioned bonding agent, when set for 30 min. at 160° C., which were the standard curing conditions of the above-mentioned curing agent, had a volume resistivity of 10 Ωcm, which was sufficiently low.

(4) The conductive paste was coated and dried with a wire coater to form the covering layer 303. The coating was conducted with a speed of 40 m/min., and the drying in a drying oven was conducted with a residence time of 2 sec. and a temperature of 120° C. The coating was conducted 5 times. The enamel coating die used had an aperture with a diameter of 150 to 200 μm. The conductive paste 303, coated on the wire 302, is present in an uncured state, after evaporation of the solvent. The thickness of the conductive paste 303 was 20 μm, and the fluctuation in the thickness after coating over 100 m was within ±1.5 μm.

In the following the method of preparing the solar cell of the present invention shown in FIGS. 1A and 1B will be explained, utilizing the current collecting electrode formed in the foregoing steps (1) to (4).

(5) The solar cell body 100 used was prepared by degreasing and rinsing a SUS430BA substrate as the substrate 101, and depositing 400 nm Ag and 400 nm ZnO as the first electrode 102, by means of a DC sputtering apparatus.

(6) Then a bottom junction layer, a middle junction layer, and a top junction layer were formed in succession, utilizing a microwave plasma CVD apparatus.

The bottom junction layer had a laminated structure formed in succession by an n-layer 103, an i-layer 104, and a p-layer 105, wherein the i-layer 104 was composed of a-SiGe. The middle junction layer had a laminated structure formed in succession by an n-layer 113, an i-layer 114, and a p-layer 115, wherein the i-layer 114 was composed of a-SiGe. The top junction layer had a laminated structure formed in succession by an n-layer 123, an i-layer 124, and a p-layer 125, wherein the i-layer was composed of a-Si.

(7) On the light-incident side an ITO transparent conductive film was formed as the transparent electrode 106, by means of a resistance-heated evaporation apparatus.

(8) A cell obtained in the step (7) was subjected to the removal of the transparent conductive film in the outer periphery thereof, by means of etching paste principally composed of ferric chloride and a commercially available printing machine, so as to obtain a square shape with a length of 30 cm and a cell effective area of 900 cm².

(9) A double-sided adhesive tape (VHB supplied by Sumitomo 3M Co.) was adhered as the adhesive material 504, and current collecting electrodes 503 were positioned at a pitch of 5.5 mm and fixed with the double-sided adhesive tape mentioned above.

(10) A copper foil, consisting of hard copper with clad silver, was positioned as the bus bar(s) 505, on the current collecting electrodes 503, and the adhesive material 504.

(11) For bonding the current collecting electrodes 503 onto the transparent conductive film, heating and pressing were conducted with a heating apparatus, under the conditions of a temperature of 190° C., a time of 1 min., and a pressure of 1 kg/cm². FIG. 5A shows a cross-sectional view in which the current collecting electrodes 503 are shown bonded onto the semiconductor layer 502.

(12) For bonding the current collecting electrodes 503 to the bus bar 505, heating and pressing were conducted with a heating apparatus, under the conditions of a temperature of 190° C., a time of 15 sec., and a pressure of 5 kg/cm².

(13) A solar cell 500, prepared by the process up to step (12), was encapsulated to obtain a solar cell module. The encapsulation was conducted in the following manner.

The solar cell substrate 500 was at first sandwiched between ordinary glass plates with EVA therebetween, further sandwiched between fluorinated resin ETFE films and subjected to lamination for 60 min. at 150° C. in a vacuum laminator.

10 similar solar cell modules were prepared via the foregoing steps (1) to (13).

In the following, the evaluation tests of the initial characteristics of thus obtained samples will be explained.

(a) The voltage-current characteristics of the samples were measured in the dark state to evaluate the shunt resistance from the slope around the original point. As a result, the shunt resistance was in a satisfactory range of from 200 to 500 k$\Omega$cm².

(b) The conversion efficiency was determined by measuring the solar cell characteristics with a pseudo solar light source (hereinafter referred to as a simulator) having a solar light spectrum of AM1.5 global and a light intensity of 100 mW/cm². As a result, the conversion efficiency was 8.7±0.02% with satisfactorily limited fluctuation.

In the following, the reliability test conducted on the obtained samples will be explained. The reliability test was conducted according to the ambient test method of the Japan Industrial Standard C8917 for crystalline solar cells and the temperature-moisture cycle test A-2 defined in the durability test method defined therein. More specifically, a cyclic test of maintaining the sample in a chamber with controlled temperature and moisture and varying the temperature from −40° C. to +85° C. at a relative humidity of 85% was repeated 20 times. Thereafter the conversion efficiency was evaluated with the simulator, as in the evaluation of the initial characteristics. As a result, the conversion efficiency after the reliability test was an average 2% lower than the initial conversion efficiency. Based on this amount of lowering, there was no significant deterioration.

The above-mentioned results indicate that the solar cell of the present invention has satisfactory characteristics and is highly reliable.

Reference Example 1

Figures 9, 9A:
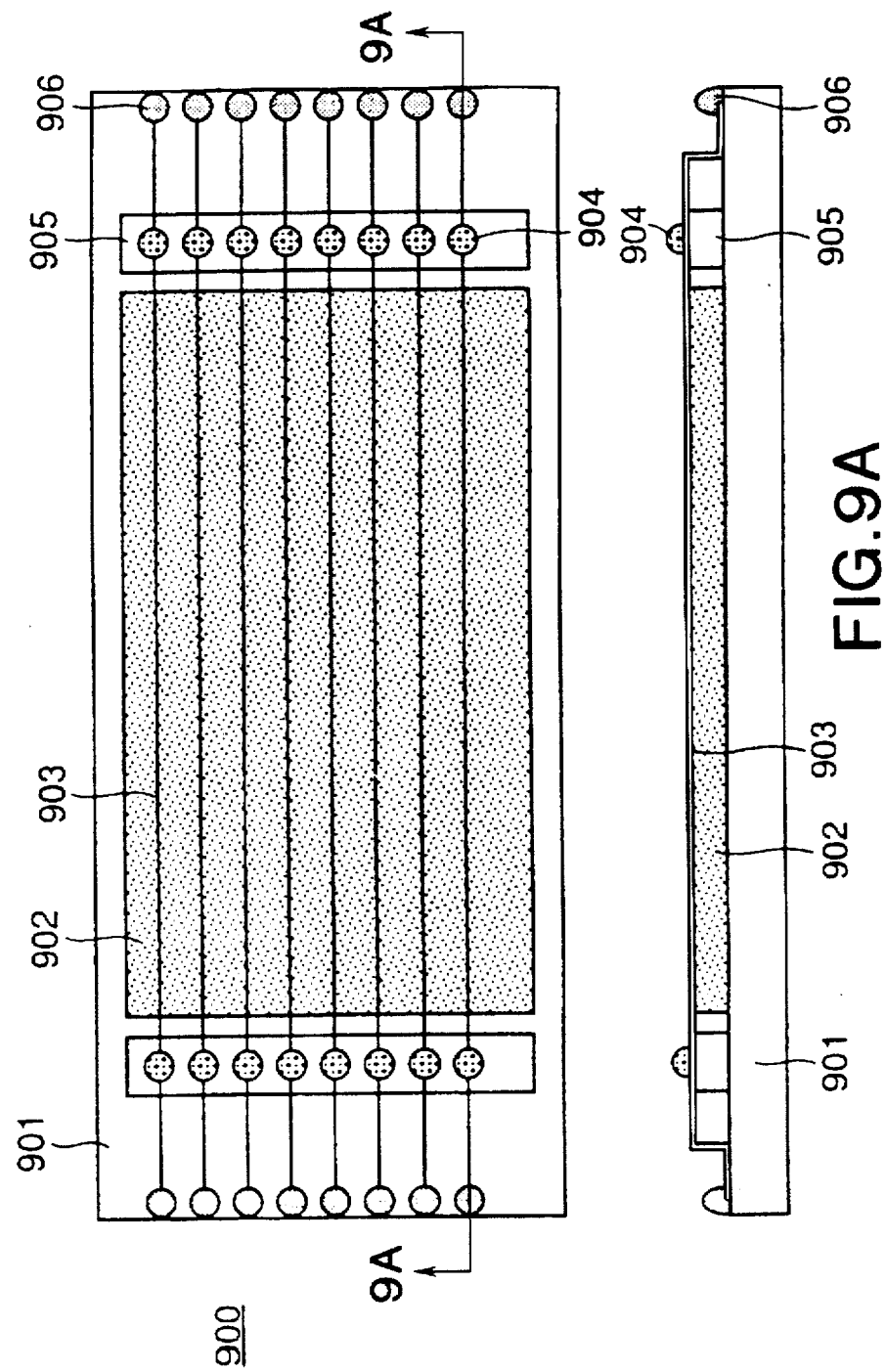
FIGS. 9 and 9A are schematic views of a solar cell employing the conventional electrode configuration.

This example is different from example 1 in that the current collecting electrode has the conventional configuration shown in FIG. 9, or in that the current collecting electrode is fixed to the bus bar with an ultraviolet-settable bonding agent.

Referring to FIG. 9, there are shown a main body 900 of the solar cell; a solar cell surface 902; current collecting electrodes 903; solder 904; bus bars 905; and bonding agent 906 for temporarily fixing the current collecting electrodes. The substrate 901, the current collecting electrodes 903, and the bus bar 905 were the same as those employed in example 1.

The method for preparing the solar cell module of this example will be explained in the following.

(1) The solar cell substrate 901 was subjected to removal of the transparent conductive film in the unnecessary areas, by means of etching paste principally composed of ferric chloride and a commercially available printing machine, so as to obtain a square shape with a length of 30 cm and a cell effective area of 900 cm².

(2) The bus bars 905 were positioned and bonded outside the effective area. Then the current collecting electrodes 903 were placed with a pitch of 5.5 mm and fixed with ultraviolet-settable bonding agent 906, outside of the bus bars. Then, in order to bond the current collecting electrodes 903 to the cell surface of the solar cell substrate 901, heating and pressing were conducted with a heating apparatus, under conditions of a temperature of 190° C., a time of 1 min., and a pressure of 1 kg/cm².

(3) For bonding the current collecting electrodes 903 to the bus bar 905, the electrodes 903 were fixed by fusing solder 904 at 300° C. on the bus bar 905. Since the soldering of the coated metal wire to the bus bar was not easy, a part of the covering of the wire was removed and solder with rosin was employed. After the soldering, rinsing with IPA was conducted to remove the rosin contained in the solder.

(4) The solar cell substrate prepared up to step (3) was encapsulated to obtain a solar cell module. The method of encapsulation was the same as that in example 1.

Other steps were the same as in example 1.

Ten similar solar cell modules were prepared via the process explained above.

The initial characteristics of thus prepared samples were evaluated under the same conditions as in example 1. The conversion efficiency was 6.0±1.02%, indicating a larger fluctuation of the characteristics. Also, shunting was observed in some samples.

The conversion efficiency of the obtained samples after the reliability test was evaluated with the simulator as in the evaluation of the initial characteristics in the same manner as in example 1.

The conversion efficiency after the reliability test was an average of 20% lower, in comparison with the initial conversion efficiency, indicating significant deterioration. Also, the proportion of shunts was increased.

The results of the foregoing example 1 and the reference example 1 indicate that the solar cell employing the current collecting electrodes of the present invention provides a higher initial yield and a higher reliability.

Reference Example 2

This example employs the current collecting electrode of conventional structure, and is different from reference example 1 in that the current collecting electrode is bonded to the bus bar with silver paste.

More specifically, for bonding the current collecting electrodes 903 to the bus bars 905, the electrodes 903 were positioned on the bus bars 905 and silver paste 904 (C-220 supplied by Amikon Co.) was applied in dots. Subsequently, the silver paste 904 was hardened in a hot air oven, under the conditions of 150° C. for 30 min.

Then encapsulation was conducted in the same manner as in example 1 to obtain a solar cell module.

Ten similar solar cell modules were prepared via the process explained above.

The initial characteristics of thus prepared samples were evaluated under the same conditions as in example 1. The conversion efficiency was 6.1±0.92%, indicating a significant fluctuation in the characteristics. In some of the samples the series resistance was high because of unsatisfactory bonding, as the current collecting electrode 903 was separated from the bus bar 905 in the course of drying and hardening of the silver paste.

The conversion efficiency of the obtained samples after the reliability test was evaluated with the simulator as in the evaluation of the initial characteristics in the same manner as in example 1.

The conversion efficiency after the reliability test was an average of 17% lower, in comparison with the initial conversion efficiency, indicating significant deterioration. Also, an increase in the series resistance was observed.

The results of the foregoing example 1 and the reference example 2 indicate that the solar cell employing the current collecting electrode of the present invention provides a higher initial yield and a higher reliability.

EXAMPLE 2

In this example, a solar cell module, consisting of a solar cell constructed as shown in FIGS. 1A and 1B and having the electrode configuration shown in FIG. 6, was prepared in the following manner.

Referring to FIG. 6, there are shown a solar cell substrate 601; a solar cell surface 602; current collecting electrodes 603; adhesive material 604; and bus bars 605. The solar cell substrate 601, the current collecting electrodes 603, the adhesive material 604, and the bus bars 605 were the same as those in example 1.

In the following there will be explained the method for preparing the solar cell module of this example.

(1) The solar cell substrate 601 was subjected to removal of the transparent conductive film in the unnecessary areas, by means of an etching paste principally composed of ferric chloride and a commercially available printing machine, so as to obtain a square shape with a length of 30 cm and with a cell effective area of 900 cm².

(2) on the bottom surface of the solar cell substrate, adhesive tapes (VHB supplied by Sumitomo 3M Co.) were adhered as the adhesive material 604, then the current collecting electrodes 603 were arranged with a pitch of 5.5 mm, folded back to the bottom surface and fixed on the above-mentioned adhesive material. In order not to cause short circuiting of the current collecting electrodes 603 at the edge portion or on the bottom surface of the solar cell substrate 601, the adhesive tapes 604 were so placed as to sufficiently insulate the cathode portions at the edge and on the bottom surface. Then a copper foil, consisting of hard copper clad with silver, was placed as the bus bars 605 on the current collecting electrodes 603 and the adhesive material 604.

(3) For bonding the current collecting electrodes 603 to the surface of the semiconductor layer 602, heating and pressing were conducted with a heating apparatus, under conditions of a temperature of 190° C., a time of 1 min., and a pressure of 1 kg/cm². Also, for bonding the current collecting electrodes 603 to the bus bar 605, heating and pressing were conducted with a heating apparatus, under conditions of a temperature of 190° C., a time of 15 sec., and a pressure of 5 kg/cm².

(4) The solar cell prepared up to step (3) was then encapsulated to obtain a solar cell module. The method of encapsulation was the same as that in example 1.

Other steps were the same as in reference example 1.

Ten similar solar cell modules were prepared via the process explained above.

Evaluation, under the same conditions as in example 1, of the initial characteristics of the thus prepared samples was performed. The characteristics were satisfactory with limited fluctuation, showing a shunt resistance of 200–500 kΩcm² and a conversion efficiency of 9.0±0.02%.

The conversion efficiency of the samples was measured with the simulator as in the evaluation of the initial characteristics, of after the reliability test in the same manner as in example 1.

The conversion efficiency after the reliability test was an average 2% lower, in comparison with the initial conversion efficiency, indicating the absence of significant deterioration.

The results of this example indicate that the solar cell of the present invention provides satisfactory characteristics and a higher reliability.

EXAMPLE 3

In this example, a solar cell module, consisting of a solar cell constructed as shown in FIGS. 2A and 2B and having the electrode configuration shown in FIGS. 7A and 7B, was prepared in the following manner.

Referring to FIGS. 7A and 7B, there are shown a solar cell main body 700; a semiconductor layer 702; a current collecting electrode 703; bus bars 705; and adhesive material 704. The current collecting electrode 703, the bus bar(s) 705, and the adhesive material 704 were the same as those in example 1.

The solar cell shown in FIGS. 2A and 2B was prepared with the current collecting electrodes prepared in the same manner as in example 1. The solar cell main body 700 was obtained by using a crystalline solar cell substrate prepared in the following manner.

In the following there will be explained the method of preparing the solar cell module of this example.

(1) A silicon single crystal, doped p type, was prepared by a CZ crystal growing method, and was sliced to obtain a silicon wafer 201 of a thickness of about 300 μm.

(2) On the wafer 201, $P_2O_5$ was coated and diffused to form an $n^+$ layer 202.

(3) On the rear surface (opposite to the $n^+$ layer 202) of the wafer 201, silver paste was printed by means of a screen printing machine and heated to form a lower electrode 203.

(4) On the surface bearing the above-mentioned $n^+$ layer 202, an adhesive tape as in example 1 was provided at the center as the adhesive material 205, and the current collecting electrodes as in example 1 were positioned in a similar manner on the $n^+$ layer 202 constituting the light-receiving surface.

(5) A copper foil, consisting of hard copper clad with silver, was positioned, as the bus bar 206 (705), on the current collecting electrodes 204 (703) and the adhesive material 205 (704).

(6) The current collecting electrodes 204 (703) and the bus bar 206 (705) were formed by heating and pressing, in a similar manner as in example 1, with an electrode pitch of 8.5 mm.

(7) A SiO$_2$ film not shown in the drawing was formed by sputtering, as an antireflective film.

(8) The solar cell substrate prepared up to step (7) was encapsulated to obtain a solar cell module. The method of encapsulation was the same as that in the example 1.

Ten similar solar cell modules were prepared via the process explained above.

Evaluation, under the same conditions as in example 1, of the initial characteristics of the thus prepared samples was performed. The characteristics were satisfactory with limited fluctuation, showing a shunt resistance of 300 to 650 kΩcm$^2$ and a conversion efficiency of 10.2±0.02%.

The conversion efficiency of the samples was measured with the simulator as in the evaluation of the initial characteristics, of after the reliability test in the same manner as in example 1.

The conversion efficiency after the reliability test was on average 2% lower, in comparison with the initial conversion efficiency, indicating the absence of significant deterioration.

The results of this example indicate that the solar cell employing the current collecting electrode of the present invention, consisting of the metal wire covered with conductive resin, provides satisfactory characteristics and a higher reliability.

EXAMPLE 4

In this example, a solar cell module, consisting of a solar cell constructed as shown in FIGS. 1A and 1B and having the electrode configuration shown in FIG. 8, was prepared in the following manner.

Referring to FIG. 8, there are shown a solar cell main body 800; a semiconductor film 802; current collecting electrodes 803; adhesive material 804; bus bar(s) 805; and conductive bonding agent 806.

In the following there will be explained the method of preparing the solar cell module of this example.

(1) A transparent conductive film was formed on the surface of semiconductor layer 802 and patterned in the same manner as in example 1.

(2) An adhesive tape as in example 1 was adhered as the adhesive material 804. Silver-clad copper wires of a diameter of 100 μm, having a clad silver layer of a thickness of 2 μm, were positioned with a pitch of 5.5 mm as the current collecting electrodes 803, and fixed on the above-mentioned adhesive material.

(3) A copper foil, consisting of hard copper clad with silver and serving as the bus bars 805, was coated with conductive paste similar to that coated on the metal wire in example 1 and was positioned on the current collecting electrodes 803 and the adhesive material 804.

(4) Conductive paste 806 was applied in dots with a pitch of 5 mm on the current collecting electrodes 803, by means of a dot dispensing machine. After the conductive paste was dried, heating and pressing were conducted as in example 1 to form the current collecting electrodes 803, under conditions of a temperature of 190° C., a time of 1 min., and a pressure of 0.5 kg/cm$^2$.

(5) For bonding the current collecting electrodes 803 to the bus bar 805, heating and pressing were conducted with a heating apparatus, under conditions of a temperature of 190° C., a time of 15 sec., and a pressure of 5 kg/cm$^2$.

(6) The solar cell substrate prepared up to step (5) was encapsulated to obtain a solar cell module. The method of encapsulation was the same as that in example 1.

Ten similar solar cell modules were prepared through the process explained above.

Evaluation, under the same conditions as in example 1, of the initial characteristics of the thus prepared samples was performed. The characteristics were satisfactory with limited fluctuation, showing a shunt resistance of 200 to 300 kΩcm$^2$ and a conversion efficiency of 8.7±0.02%.

The conversion efficiency of the samples was measured with the simulator as in the evaluation of the initial characteristics, after the reliability test in the same manner as in example 1.

The conversion efficiency after the reliability test was on average 2% lower, in comparison with the initial conversion efficiency, indicating the absence of significant deterioration.

The results of this example indicate that the solar cell of the present invention provides satisfactory characteristics and a higher reliability.

As explained in the foregoing, the present invention provides an electrode configuration for photovoltaic devices, providing satisfactory current collecting property, satisfactory work efficiency, and a high throughput.

Also, the electrode configuration of the present invention provides photovoltaic devices with satisfactory initial characteristics and satisfactory long-term reliability, and a high production yield of the photovoltaic devices.

What is claimed is:

1. A photovoltaic device comprising a semiconductor layer, an adhesive or a bonding agent on said semiconductor layer, a current collecting electrode fixed on said adhesive or bonding agent, and a bus bar fixed on said adhesive or bonding agent and electrically connected to said current collecting electrode, wherein said current collecting electrode comprises a metal wire; and said bus bar is located on said current collecting electrode.

2. A photovoltaic device according to claim 1, wherein at least a part of said metal wire is covered with conductive paste.

3. A photovoltaic device according to claim 1, wherein at least a part of said bus bar is covered with conductive paste.

4. A photovoltaic device according to claim 2 or 3, wherein said conductive paste comprises conductive particles and polymeric resin.

5. A photovoltaic device according to claim 4, wherein said polymeric resin comprises at least one selected from epoxy resin, urethane resin, phenolic resin, polyvinylformal resin, alkyd resin, phenoxy resin, polyamidimide resin, polyamide resin, melamine resin, butyral resin, fluorinated resin, acrylic resin, styrene resin, and polyester resin.

6. A photovoltaic device according to claim 4, wherein said conductive particles comprise at least one selected from graphite, carbon black, In$_2$O$_3$, TiO$_2$, SnO$_2$, ITO, ZnO, and doped semiconductor oxides.

7. A photovoltaic device according to claim 1, wherein said bonding agent is at least one selected from acrylic, rubber, silicone, polyvinylether, epoxy, polyurethane, nylon, polyamide, inorganic, and composite bonding agents.

8. A photovoltaic device according to claim 1, wherein said bonding agent is electroconductive.

9. A photovoltaic device according to claim 1, wherein said adhesive is an adhesive tape.

10. A photovoltaic device according to claim 9, wherein said adhesive tape is electroconductive.

11. A photovoltaic device according to claim 1, wherein said bus bar comprises at least one material selected from Cu, Ag, Au, Pt, Al, Sn, Pb, and Ni.

12. A photovoltaic device according to claim 1, wherein the surface of said bus bar is covered with a metal layer.

13. A photovoltaic device according to claim 12, wherein said metal layer is composed of at least one material selected from Ag, Pd, an Ag—Pd alloy, Ag, Ni, Sn, and alloys thereof.

14. A photovoltaic device according to claim 1, wherein said metal wire is composed of at least one metal selected from Cu, Ag, Au, Pt, Al, Mo, and W.

15. A photovoltaic device according to claim 14, wherein the surface of said metal wire is further covered with a metal layer.

16. A photovoltaic device according to claim 15, wherein said metal layer is composed of at least one material selected from Ag, Pd, an Ag—Pd alloy, Ni, Sn, and alloys thereof.

17. A photovoltaic device according to claim 1, wherein said metal wire has a diameter from 25 μm to 1 mm.

18. A photovoltaic device according to claim 1, wherein said semiconductor layer is non-monocrystalline.

19. A photovoltaic device according to claim 1, further comprising a transparent conductive layer between said semiconductor layer and said current collecting electrode.

20. A photovoltaic device comprising a semiconductor layer laminated on a first portion of a substrate, an adhesive or bonding agent on a second portion of said substrate, a current collecting electrode fixed on said adhesive or bonding agent, and a bus bar fixed on said adhesive or bonding agent and electrically connected to said current collecting electrode,
wherein said current collecting electrode comprises a metal wire; and, said bus bar is located on said current collecting electrode.

21. A photovoltaic device according to claim 20, wherein said current collecting electrode and bus bar are connected with conductive paste.

22. A photovoltaic device according to claim 20, wherein at least a part of said metal wire is covered with conductive paste.

23. A photovoltaic device according to claim 21 or 22, wherein said conductive paste comprises conductive particles and polymeric resin.

24. A photovoltaic device according to claim 23, wherein said polymeric resin comprises at least one selected from epoxy resin, urethane resin, phenolic resin, polyvinylformal resin, alkyd resin, phenoxy resin, polyamidimide resin, polyamide resin, melamine resin, butyral resin, fluorinated resin, acrylic resin, styrene resin, and polyester resin.

25. A photovoltaic device according to claim 23, wherein said conductive particles comprise at least one selected from graphite, carbon black, $In_2O_3$, $TiO_2$, $SnO_2$, ITO, ZnO, and doped semiconductor oxides.

26. A photovoltaic device according to claim 21, wherein at least a part of said bus bar is covered with said conductive paste.

27. A photovoltaic device according to claim 20, wherein said bonding agent is at least one selected from acrylic, rubber, silicone, polyvinyl-ether, epoxy, polyurethane, nylon, polyamide, inorganic, and composite bonding agents.

28. A photovoltaic device according to claim 21, wherein said bonding agent is electroconductive.

29. A photovoltaic device according to claim 20, wherein said adhesive is an adhesive tape.

30. A photovoltaic device according to claim 28, wherein said adhesive tape is electroconductive.

31. A photovoltaic device according to claim 20, wherein the surface of said bus bar is covered with a metal layer.

32. A photovoltaic device according to claim 31, wherein said metal layer is composed of at least a material selected from Ag, Pd, an Ag—Pd alloy, Ni, Sn, and alloys thereof.

33. A photovoltaic device according to claim 20, wherein said metal wire is composed of at least one metal selected from Cu, Ag, Au, Pt, Al, Mo, and W.

34. A photovoltaic device according to claim 33, wherein the surface of said metal wire is further covered with a metal layer.

35. A photovoltaic device according to claim 34, wherein said metal layer is composed of at least a material selected from Ag, Pd, an Ag—Pd alloy, Ni, Sn, and alloys thereof.

36. A photovoltaic device according to claim 20, wherein said metal wire has a diameter from 25 μm to 1 mm.

37. A photovoltaic device according to claim 20, wherein said semiconductor layer is non-monocrystalline.

38. A photovoltaic device according to claim 20, further comprising a transparent conductive layer between said semiconductor layer and said current collecting electrode.

39. A method for forming a photovoltaic device comprising the steps of:
arranging a bonding agent or an adhesive on at least a portion of a semiconductor layer or a transparent conductive layer formed on said semiconductor layer;
fixing a current collecting electrode comprising a metal wire on said semiconductor layer or said transparent conductive layer with said bonding agent or adhesive;
arranging a bus bar on said current collecting electrode and on said adhesive or said bonding agent and fixing said bus bar to said adhesive or bonding agent; and
electrically connecting said current collecting electrode and said bus bar.

40. A method according to claim 39, wherein said metal wire is coated with a conductive paste, at least at a section contacting said bus bar, and said step for electrically connecting said bus bar to said current collecting electrode comprising said metal wire is conducted by closely contacting said bus bar and said current collecting electrode comprising said metal wire and heating.

41. A method according to claim 39, wherein said bus bar is coated with a conductive paste, at least at a section contacting said metal wire, and said step for electrically connecting said bus bar to said current collecting electrode comprising said metal wire is conducted by closely contacting said bus bar and said current collecting electrode comprising said metal wire and heating.

42. A method for forming a photovoltaic device comprising the steps of:
forming a semiconductor layer on a first portion of a substrate;
arranging an adhesive or a bonding agent on a second portion of said substrate;
fixing a current collecting electrode comprising a metal wire by said adhesive or said bonding agent on a semiconductor layer or on a transparent conductive electrode formed on said semiconductor layer;
arranging a bus bar on said current collecting electrode and on said adhesive or said bonding agent and fixing said bus bar to said adhesive or said bonding agent and electrically connecting said bus bar to said current collecting electrode.

43. A method according to claim 42, wherein said metal wire is coated with a conductive paste at least at a section contacting said bus bar, and said step for electrically connecting said bus bar to said current collecting electrode comprising said metal wire is conducted by closely contacting said bus bar with said current collecting electrode comprising said metal wire and heating.

44. A method according to claim 42, wherein said metal wire is coated with a conductive paste at least at a section contacting said metal wire and said step for electrically connecting said bus bar to said current collecting electrode comprising said metal wire is conducted by closely contacting said bus bar and said current collecting electrode comprising said metal wire and heating.

45. A method according to claim 39 or 42, wherein said metal wire is completely coated with a conductive paste, said step for electrically connecting said bus bar and said current collecting electrode comprising said metal wire is conducted by closely contacting said bus bar and the current collecting electrode comprising said metal wire and by heating.

46. A method according to claim 45, wherein simultaneously with said step for electrically connecting said bus bar and said current collecting electrode comprising the metal wire, closely contacting said current collecting electrode with said semiconductor layer or with a transparent conductive layer formed on said semiconductor layer, and heating to fix said closely contacted current collecting electrode with said semiconductor layer or said transparent conductive layer.

47. A photovoltaic device comprising: a semiconductor layer laminated on a substrate; an adhesive or a bonding agent at a bottom surface of said substrate; and a current collecting electrode in electrical contact with the surface of said semiconductor layer, and comprising a metal wire and a bus bar fixed on said adhesive or said bonding agent, said bus bar arranged on said current collecting electrode and electrically connected thereto.

48. A photovoltaic device according to claim 47, wherein at least a part of said metal wire is covered with conductive paste.

49. A photovoltaic device according to claim 47, wherein at least a part of said bus bar is covered with conductive paste.

50. A photovoltaic device according to claim 48 or 49, wherein said conductive paste comprises conductive particles and polymeric resin.

51. A photovoltaic device according to claim 50, wherein said polymeric resin comprises at least one selected from epoxy resin, urethane resin, phenolic resin, polyvinylformal resin, alkyd resin, phenoxy resin, polyamidimide resin, polyamide resin, melamine resin, butyral resin, fluorinated resin, acrylic resin, styrene resin and polyester resin.

52. A photovoltaic device according to claim 50, wherein said conductive particles comprise at least one selected from graphite, carbon black, $In_2O_3$, $TiO_2$, $SnO_2$, ITO, ZnO, and doped semiconductor oxides.

53. A photovoltaic device according to claim 47, wherein said bonding agent is at least one selected from acrylic, rubber, silicone, polyvinyl ether, epoxy, polyurethane, nylon, polyamide, inorganic, and composite bonding agents.

54. A photovoltaic device according to claim 47, wherein said bonding agent is electroconductive.

55. A photovoltaic device according to claim 47, wherein adhesive is an adhesive tape.

56. A photovoltaic device according to claim 55, wherein said adhesive tape is electroconductive.

57. A photovoltaic device according to claim 47, wherein said bus bar comprises at least one material selected from Cu, Ag, Au, Pt, Al, Sn, Pb, and Ni.

58. A photovoltaic device according to claim 47, wherein the surface of said bus bar is covered with a metal layer.

59. A photovoltaic device according to claim 58, wherein said metal layer is composed of at least one material selected from Ag, Pd, an Ag—Pd alloy, Ag, Ni, Sn, and alloys thereof.

60. A photovoltaic device according to claim 47, wherein said metal wire is composed of at least one metal selected from Cu, Ag, Au, Pt, Al, Mo, and W.

61. A photovoltaic device according to claim 60, wherein the surface of said metal wire is further covered with a metal layer.

62. A photovoltaic device according to claim 61, wherein said metal layer is composed of at least one material selected from Ag, Pd, an Ag—Pd alloy, Ni, Sn, and alloys thereof.

63. A photovoltaic device according to claim 47, wherein said metal wire has a diameter from 25 μm to 1 mm.

64. A photovoltaic device according to claim 47, wherein said semiconductor layer is non-monocrystalline.

65. A photovoltaic device according to claim 47, further comprising a transparent conductive layer between said semiconductor layer and said current collecting electrode.

* * * * *